United States Patent
Pindl et al.

(10) Patent No.: US 6,410,407 B1
(45) Date of Patent: Jun. 25, 2002

(54) PRODUCT INCLUDING A SILICON-CONTAINING FUNCTIONAL LAYER AND AN INSULATING LAYER MADE OF SILICON DIOXIDE, AND METHOD FABRICATING THE PRODUCT

(75) Inventors: Stephan Pindl, Petershausen; Markus Biebl, Augsburg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/539,235

(22) Filed: Mar. 30, 2000

Related U.S. Application Data

(63) Continuation of application No. PCT/DE98/02181, filed on Jul. 30, 1998.

(30) Foreign Application Priority Data

Sep. 30, 1997 (DE) .......................... 197 43 297

(51) Int. Cl.⁷ .......................... H01L 21/20; H01L 21/36
(52) U.S. Cl. .................. 438/480; 438/474; 438/766
(58) Field of Search .................. 438/455, 474, 438/480, 481, 766

(56) References Cited

U.S. PATENT DOCUMENTS

| | | | |
|---|---|---|---|
| 4,885,257 A | * 12/1989 | Matsushita | ................ 438/474 |
| 5,362,667 A | 11/1994 | Linn et al. | ................ 438/455 |
| 5,436,175 A | * 7/1995 | Nakato et al. | ............ 438/766 |
| 5,468,657 A | * 11/1995 | Hsu | ......................... 438/766 |
| 5,734,195 A | * 3/1998 | Takizawa et al. | ......... 257/607 |

OTHER PUBLICATIONS

Japanese Patent Abstract No. 62219562 (Junji), dated Sep. 26, 1987.

Japanese Patent Abstract No. 06005586 (Seiichi), dated Jan. 14, 1994.

\* cited by examiner

*Primary Examiner*—Michael J. Sherry
*Assistant Examiner*—Asok Kumar Sarkar
(74) *Attorney, Agent, or Firm*—Laurence A. Greenberg; Werner H. Stemer; Ralph E. Locher

(57) ABSTRACT

A semiconductor product includes a silicon-containing functional layer, an insulating layer made of silicon dioxide, and a stop layer made of silicon nitride, which is disposed between the functional layer and the insulating layer and bonds the functional layer to the insulating layer. The stop layer acts as a diffusion barrier between the functional layer and the insulating layer. A method for fabricating this product starts out with a blank part having the functional layer and the insulating layer. The stop layer is formed by implanting nitrogen into the insulating layer and subsequently heat treating the blank part. As a result of the heat treatment the nitrogen diffuses to the functional layer where it bonds to the silicon in order to form the stop layer.

5 Claims, 1 Drawing Sheet

PRODUCT INCLUDING A SILICON-CONTAINING FUNCTIONAL LAYER AND AN INSULATING LAYER MADE OF SILICON DIOXIDE, AND METHOD FABRICATING THE PRODUCT

CROSS-REFERENCE TO RELATED APPLICATION

This application is a continuation of copending International Application Ser. No. PCT/DE98/02181, filed Jul. 30, 1998, which designated the United States.

BACKGROUND OF THE INVENTION

Field of the Invention

The invention relates to a product including a silicon-containing functional layer and an insulating layer made of silicon dioxide. The invention additionally relates to a method for fabricating such a product.

A product of the type mentioned above is known in the field of semiconductor technology, by the term "Silicon On Insulator Substrate" ("SOI substrate" hereinafter) and has the above-mentioned structure. As a rule, such a structure is built on a base layer which is likewise composed of silicon.

Such a product is described in a paper by Irita et al. in the Japanese Journal of Applied Physics 20 (1981) L909. A method for fabricating such a product is also described. The product may include a plurality of configurations made of a functional layer and an insulating layer stacked on top of one another.

According to U.S. Pat. No. 5,468,657, nitrogen is implanted into the insulating layer of a product of the type mentioned above, and subsequently a thermal treatment is carried out. In the course of this, the nitrogen migrates into a transition zone between the functional layer and the insulating layer, where it serves to saturate broken chemical bonds. Such broken chemical bonds may have been formed during the fabrication of the product, with the implantation of oxygen into silicon. Consequently, certain regions of the product are doped with nitrogen in order to passivate these regions.

In the context of the technology of electronic semiconductor components, a product of the type mentioned above can be advantageously used as a basis for an electronic semiconductor component. In this case, the semiconductor component is formed from correspondingly doped zones in the functional layer, and the insulating layer is beneficially employed for delimiting and insulating the component.

One problem that can arise in the case of a semiconductor component in a product of the type mentioned above, is the migration or segregation of dopants from the functional layer into the insulating layer by diffusion. This diffusion is particularly pronounced if the product is exposed to a heat treatment at an elevated temperature in order to fabricate the semiconductor component. In conventional practice, such a loss of dopants has to be determined by a corresponding analysis of the fabrication process and must be compensated for by a correspondingly excessive doping of the functional layer.

A substrate composed solely of silicon, without the insulating layer made of silicon dioxide, does not exhibit the segregation of the dopant material outlined above. Therefore, it is not possible to transfer or use a doping specification, which is applicable to a pure silicon substrate, to a substrate with a functional layer made of silicon on an insulating layer made of silicon dioxide of a conventional type.

SUMMARY OF THE INVENTION

It is accordingly an object of the invention to provide a product having a silicon-containing functional layer and an insulating layer made of silicon dioxide and a corresponding method of fabricating such a product which overcome the above-mentioned disadvantages of the heretofore-known products and fabrication methods of this general type and which prevent the dopant segregation described above.

With the foregoing and other objects in view there is provided, in accordance with the invention, a product, including:

a functional layer containing silicon;

an insulating layer formed of silicon dioxide; and a stop layer disposed between the functional layer and the insulating layer and connecting the functional layer to the insulating layer, the stop layer being formed of silicon nitride and having a thickness of between 2 nm and 4 nm.

In other words, the product according to the invention includes a silicon-containing functional layer and an insulating layer made of silicon dioxide and further includes, as a distinguishing feature, a stop layer made of silicon nitride. The stop layer is provided between the functional layer and the insulating layer and connects or bonds the functional layer to the insulating layer.

In the case of this product, a special stop layer is provided between the functional layer and the insulating layer. The stop layer is formed from a material in which a conventional dopant material cannot diffuse to a significant extent.

Consequently, this stop layer acts as a diffusion barrier between the functional layer and the insulating layer and accordingly prevents the segregation of a dopant from the functional layer. As a result, the stability of a doped zone in the functional layer is ensured. The stability is due to the correspondingly favorable properties of the silicon nitride itself at an elevated temperature, as may occur during a heat-treatment process that is occasionally necessary in accordance with conventional practice. As a result, the invention also makes it possible to transfer a doping specification which is applicable to a substrate composed solely of the material of the functional layer to the corresponding product according to the invention.

It is assumed that the segregation effect that is to be prevented in accordance with the invention is primarily caused by the high diffusion tendency of every customary dopant in silicon dioxide. Therefore, details of the composition of the functional layer are not a matter of absolute importance.

Despite that, in accordance with another feature of the invention, the functional layer is essentially composed of silicon.

As defined above, the stop layer has preferably a thickness of between 2 nm and 4 nm. The stop layer is thus thin enough not to have a significant influence on the relevant mechanical properties of the product and, in particular, is thin enough not to cause any undesirable mechanical stresses in the product.

The functional layer of the product is furthermore preferably essentially monocrystalline and thus allows the use of the product in the context of the conventional technology of semiconductors.

In accordance with a further feature of the invention, the functional layer is configured to be formed with doped zones.

With the objects of the invention in view there is also provided, a method for fabricating a product including a silicon-containing functional layer, an insulating layer made of silicon dioxide, and a stop layer made of silicon nitride, the stop layer being disposed between the functional layer and the insulating layer and connecting the functional layer to the insulating layer. The method includes the steps of:

provideing a blank part including a functional layer and an insulating layer, the functional layer being disposed directly on the insulating layer and being bonded to the insulating layer;

implanting nitrogen with a given dose into the insulating layer; and heat treating the blank part after the implanting step for causing a diffusion of the nitrogen to the functional layer and a bonding of the nitrogen to silicon of the functional layer for forming a stop layer with a thickness of between 2 nm and 4 nm, the thickness of the stop layer being a function of the given dose.

Consequently, the method starts out with a blank part, of the type of a conventional SOI substrate, in which the functional layer is connected or bonded directly to the insulating layer. The term blank or blank part in this context means that the part, such as the SOI substrate, is not yet in its finished state and still has to be processed. The stop layer is produced subsequently between the functional layer and the insulating layer by nitrogen being implanted into the functional layer, the nitrogen being brought by diffusion to the functional layer and being bonded to silicon of the functional layer in order to form the stop layer. The stop layer is produced automatically, as it were, with only a small thickness, since the bonding of the silicon to the nitrogen with the formation of the desired silicon nitride takes place in the context of a chemical process which is self-regulating. This chemical process is also not particularly dependent on the temperature set during the heat treatment and, consequently, is sufficiently stable during a series of repetitions. The heat treatment of the method of the invention also significantly contributes to the elimination of damage in the functional layer that may have been caused in the course of the implantation.

The stop layer is produced with a thickness of between 2 nm and 4 nm in the course of the heat treatment. This ensures that the stop layer can realize the desired effect as a diffusion barrier to the full extent.

The method does not necessarily require a functional layer composed of pure silicon. The functional layer only has to be able to provide a sufficient quantity of silicon to form the stop layer.

In principle, the geometrical parameters of the functional layer are not a matter of importance for the invention. However, if the nitrogen is intended to be implanted into the insulating layer through the functional layer, then it is advantageous, under certain circumstances, to limit the thickness of the functional layer to an adequate amount. This may make it necessary for a functional layer that is originally present to be partly removed prior to the implantation of the nitrogen and to be grown again through the use of a suitable epitaxy process after the implantation has been carried out. If appropriate, a blank or blank part having a sufficiently thin functional layer may also be used and may be provided with a functional layer having a thickness conforming to the specification by using an epitaxy after the implantation has been carried out. In any event the limiting of the path or distance that has to be traversed by the implanted nitrogen in the product contributes to ensuring that there is not an excessively wide distribution of the implanted nitrogen in the insulating layer and other regions of the product. Therefore, it is preferred to carry out the implantation of the nitrogen through the (sufficiently thin) functional layer.

In accordance with another mode of the invention, the nitrogen is implanted in such a way that a distribution of the nitrogen in the insulating layer reaches a maximum at a distance from the functional layer of between 10 nm and 20 nm. This requires careful matching of the kinetic energy with which the atoms or ions of the nitrogen to be implanted penetrate into the blank.

In accordance with a further mode of the invention, doped zones are formed in the functional layer after the implantation of the nitrogen. This allows the method of the invention to be used in the context of the technology of electronic semiconductor components.

Other features which are considered as characteristic for the invention are set forth in the appended claims.

Although the invention is illustrated and described herein as embodied in a product including a silicon-containing functional layer and an insulating layer made of silicon dioxide, and a method for fabricating such a product, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
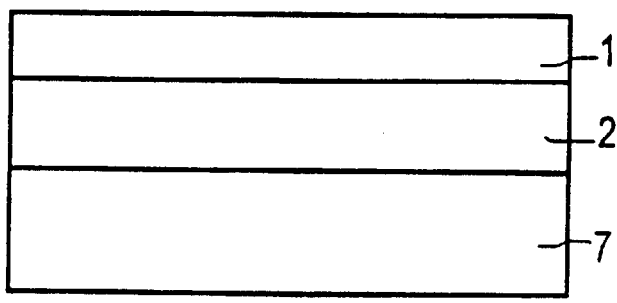
FIGS. 1 to 4 are sectional views of semiconductor configurations illustrating the production of a product according to the invention from a conventional SOI substrate.
Figure 2:
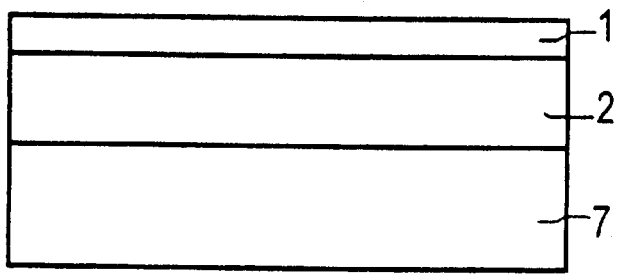
Figure 3:
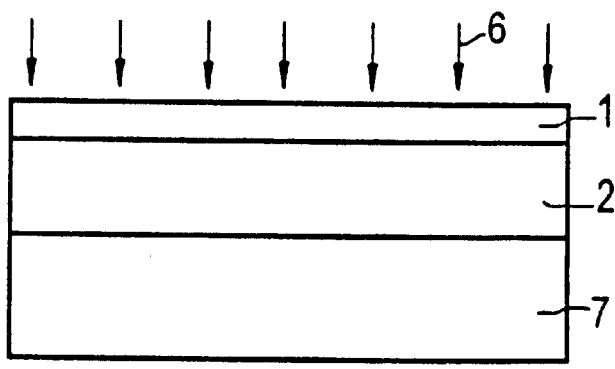

Referring now to the figures of the drawings in detail and first, particularly, to FIG. 1 thereof, there is shown a conventional SOI substrate with a functional layer 1 composed of silicon, directly connected or bonded to an insulating layer 2 composed of silicon dioxide. The silicon dioxide layer 2 is directly connected or bonded to a base layer 7 which is again composed of silicon. Accordingly, the base layer 7 can also be utilized as a further functional layer in accordance with the requirements of the respective individual case of use. As explained, it may be advantageous to thin the functional layer 1 prior to the further steps of the method, as is shown in FIGS. 1 and 2. If necessary, the functional layer 1 can be brought to a desired thickness through the use of epitaxial growth after the conclusion of the method steps to be explained below. It is noted that the drawings are not to scale, in order to emphasize specific features.

Figure 4:
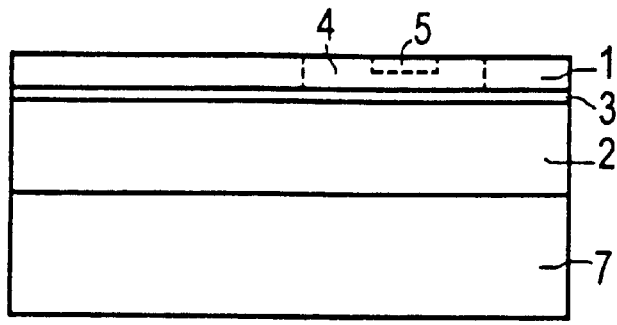

In order to form a diffusion barrier between the functional layer 1 and the insulating layer 2, nitrogen 6 is then implanted into the insulating layer 2 through the functional layer 1. The criteria which are specified as preferred criteria in the text above are met in this case. The implanted blank or blank part is then subjected to a heat treatment, in order that the nitrogen implanted into the insulating layer 2 diffuses to a sufficiently high degree and thus passes to the functional layer 1, where it can be bonded or connected with silicon to form silicon nitride, which settles, as shown in FIG. 4, as the stop layer 3 between the functional layer 1 and the insulating layer 2. The stop layer 3 again satisfies the criteria which are specified as preferred criteria in the text above. The product thus completed is distinguished by a particular suitability for the fabrication of an electronic component in the functional layer 1. Such a component is characterized by doped zones 4 and 5 which can extend entirely (reference symbol 4) or partly (reference symbol 5) through the functional layer 1 and, with regard to the selection of the dopant respectively used for doping, correspond to the requirements of the electronic semiconductor component that is to be fabricated. The fact that the product having the stop layer 3 is preferable and advantageous is due to the fact that the stop layer 3 effectively prevents a migration or segregation of dopants from the doped zones 4 and 5 into the insulating layer 2 and, consequently, ensures the long-term stability of the electronic component, which includes the doped zones 4 and 5.

We claim:

1. A method for fabricating a product including a silicon-containing functional layer, an insulating layer made of silicon dioxide, and a stop layer made of silicon nitride, the stop layer being disposed between the functional layer and the insulating layer and connecting the functional layer to the insulating layer, the method which comprises:

providing a blank part including a functional layer and an insulating layer, the functional layer being disposed directly on the insulating layer and being bonded to the insulating layer;

implanting nitrogen with a given dose into the insulating layer; and heat treating the blank part after the implanting step for causing a diffusion of the nitrogen to the functional layer and a bonding of the nitrogen to silicon of the functional layer for forming a stop layer with a thickness of between 2 nm and 4 nm, the thickness of the stop layer being a function of the given dose.

2. The method according to claim 1, wherein the implanting step includes implanting the nitrogen through the functional layer into the insulating layer.

3. The method according to claim 1, wherein the implanting step is performed such that the nitrogen is implanted with a given distribution of the nitrogen in the insulating layer, the given distribution reaching a maximum at a distance from the functional layer of between 10 nm and 20 nm, the distance defined from a bottom of the functional layer.

4. The method according to claim 1, which comprises increasing a thickness of the functional layer by an epitaxial growth after the implanting step.

5. The method according to claim 1, which comprises forming doped zones in the functional layer after the implanting step.

* * * * *